United States Patent [19]

Tanaka et al.

[11] Patent Number: 5,231,753
[45] Date of Patent: Aug. 3, 1993

[54] IC CONTACT MECHANISM

[75] Inventors: Toru Tanaka; Osamu Mitsui, both of Tokyo, Japan

[73] Assignee: Ando Electric Co., Ltd., Tokyo, Japan

[21] Appl. No.: 838,351

[22] Filed: Feb. 19, 1992

[30] Foreign Application Priority Data

Mar. 12, 1991 [JP] Japan .................................. 3-72520

[51] Int. Cl.⁵ .............................................. H05K 3/30
[52] U.S. Cl. ........................................ 29/741; 29/743; 29/759; 228/62
[58] Field of Search ............... 29/740, 743, 759, 741; 228/180.2, 6.2

[56] References Cited

U.S. PATENT DOCUMENTS

| | | | |
|---|---|---|---|
| 3,883,945 | 5/1975 | Wallis | 228/180.2 |
| 4,528,746 | 7/1985 | Yoshimura | 29/743 |
| 4,787,548 | 11/1988 | Abbagnaro et al. | 228/6.2 |
| 4,844,325 | 7/1989 | Nishiguchi et al. | 228/180.2 |
| 5,113,581 | 5/1992 | Hidese | 29/743 X |

*Primary Examiner*—Carl E. Hall
*Attorney, Agent, or Firm*—Thiel, Boutell & Tanis Flynn

[57] ABSTRACT

In case of inserting an IC having multiple pins into an IC socket so as to be brought into contact with the IC socket, a contact pressure application unit is integrated with the IC socket, whereby the IC is inserted into and brought into contact with the IC socket without bending a lead of the IC. An IC contact mechanism comprises a contact pressure application unit having a through hole at the center thereof, the contact pressure application unit also having a mold guide portion so as to contact an outer periphery of a package of an IC and a lead presser portion for pressing a lead of the IC; and a suction block having a suction pad at the tip end thereof and movable vertically in the through hole of the contact pressure application unit characterized in that the IC is inserted into a contact socket so as to be brought into contact with the contact socket while the suction pad sucks the IC.

5 Claims, 4 Drawing Sheets

IC CONTACT MECHANISM

BACKGROUND OF THE INVENTION

1. Field of the Invention

The present invention relates to an IC contact mechanism incorporating a contact pressure application unit and a suction pad incorporated thereinto.

2. Prior Art

A conventional IC contact mechanism will be described with reference to FIGS. 5 and 6.

In the same figures, designated at 4 is an IC socket, 10 is an IC, 11 is a suction nozzle and 12 is a contact pressure application unit. In FIG. 5, the IC 10 drawn by the suction nozzle 11 is conveyed over the IC socket 4 and dropped in the IC socket 4.

In FIG. 6, illustrating the state where the IC 10 is dropped in the IC socket 4, the contact pressure application unit 12, which is disposed over the IC socket 4, is lowered for thereby permitting the IC 10 to contact and push the IC socket 4. The contact pressure application unit 12 is moved upward from the state in FIG. 6 and the suction nozzle 11 is also moved for the succeeding operation.

In FIGS. 5 and 6, the conveyed IC 10 is dropped in the IC socket 4. The IC 10 is dropped in the IC socket 4 along the tapered portion 4A of the IC socket 4. There is a likelihood that the IC 10 has flashes at the package or the lead thereof.

FIG. 7 illustrates the state where the IC 10 is caught by the tapered portion 4A of the IC socket 4. There is a likelihood that the IC 10 is caught by the tapered portion 4A of the IC socket 4 and not dropped in the IC socket 4 depending on the size and the shape of the IC 10.

The lead of the IC 10 is improved by providing multiple pins or narrowing pitches between the pins but weak by an external force, whereby the lead is liable to bend even if it contacts the tapered portion 4A when it is dropped.

FIG. 8 illustrates the state where the IC 10 is dropped while it is inclined relative to the IC socket 4. When the IC 10 is dropped while it is inclined, the lead of the IC 10 strikes against the tapered portion 4A, whereby the lead of the IC 10 is liable to bend.

SUMMARY OF THE INVENTION

It is an object of the present invention to provide an IC contact mechanism which incorporates therein the contact pressure unit 12 and the suction pad 11 and is capable of inserting the IC 10 into the IC socket 4 without bending the lead of the IC 10 so that the IC 10 can be brought into contact with the IC socket 4.

To achieve the object of the present invention, the IC contact mechanism comprises a contact pressure application unit having a through hole at the center thereof, the contact pressure application unit also having a lateral guide portion so as to contact an outer periphery of a package of an IC and a lead presser portion for pressing a lead of the IC and a suction block having a suction pad at the tip end thereof and movable vertically in the through hole of the contact pressure application unit, characterized in that the IC is inserted into a contact socket so as to be brought into contact with the contact socket while the suction pad sucks the IC.

DESCRIPTION OF THE PREFERRED EMBODIMENT

An IC contact mechanism according to a preferred embodiment of the present invention will be described with reference to FIGS. 1 to 4.

The IC contact mechanism comprises a contact pressure application unit 1 having a through hole 1A, a suction block 3 which is held and vertically movable inside the through hole 1A and a suction pad 2 which is attached to the tip end of the suction block 3 and capable of drawing an IC 10.

Figure 1:
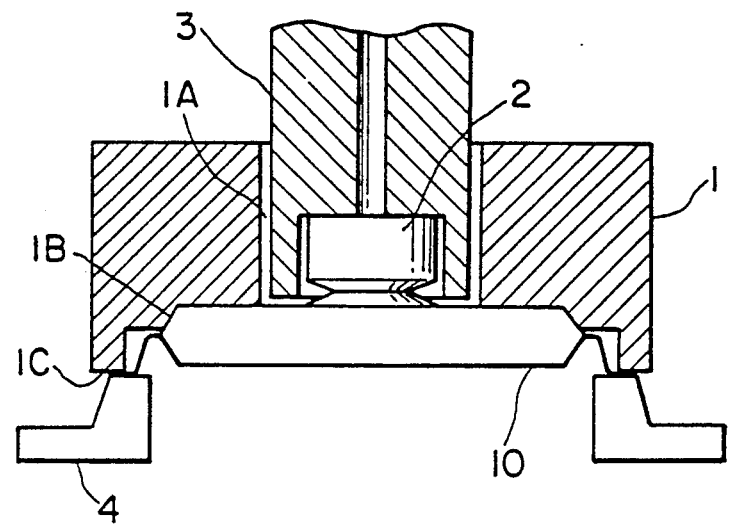
FIG. 1 is a partly cut-away view of an arrangement of an IC contact mechanism according to a preferred embodiment of the present invention.
Figure 2:
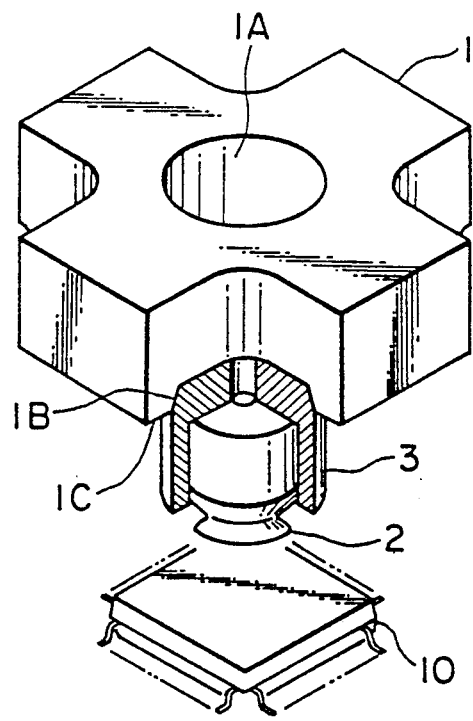
FIG. 2 is an exploded perspective view of FIG. 1.

In FIG. 1, the IC 10, which is drawn by the suction pad 2, is inserted into and brought into contact with an IC socket 4. The contact pressure application unit 1 has a lateral guide portion 1B which contacts an outer lateral periphery of the IC 10 to accurately laterally position the IC with respect to the contact pressure application unit and a lead presser portion 1C which presses a lead of the IC 10. The lead presser portion 1C is formed so as to closely contact the upper surface of the lead of the IC 10, whereby the IC 10 can contact the IC socket 4 without bending the lead even if the external force is applied to the lower surface of the lead.

Figure 3:
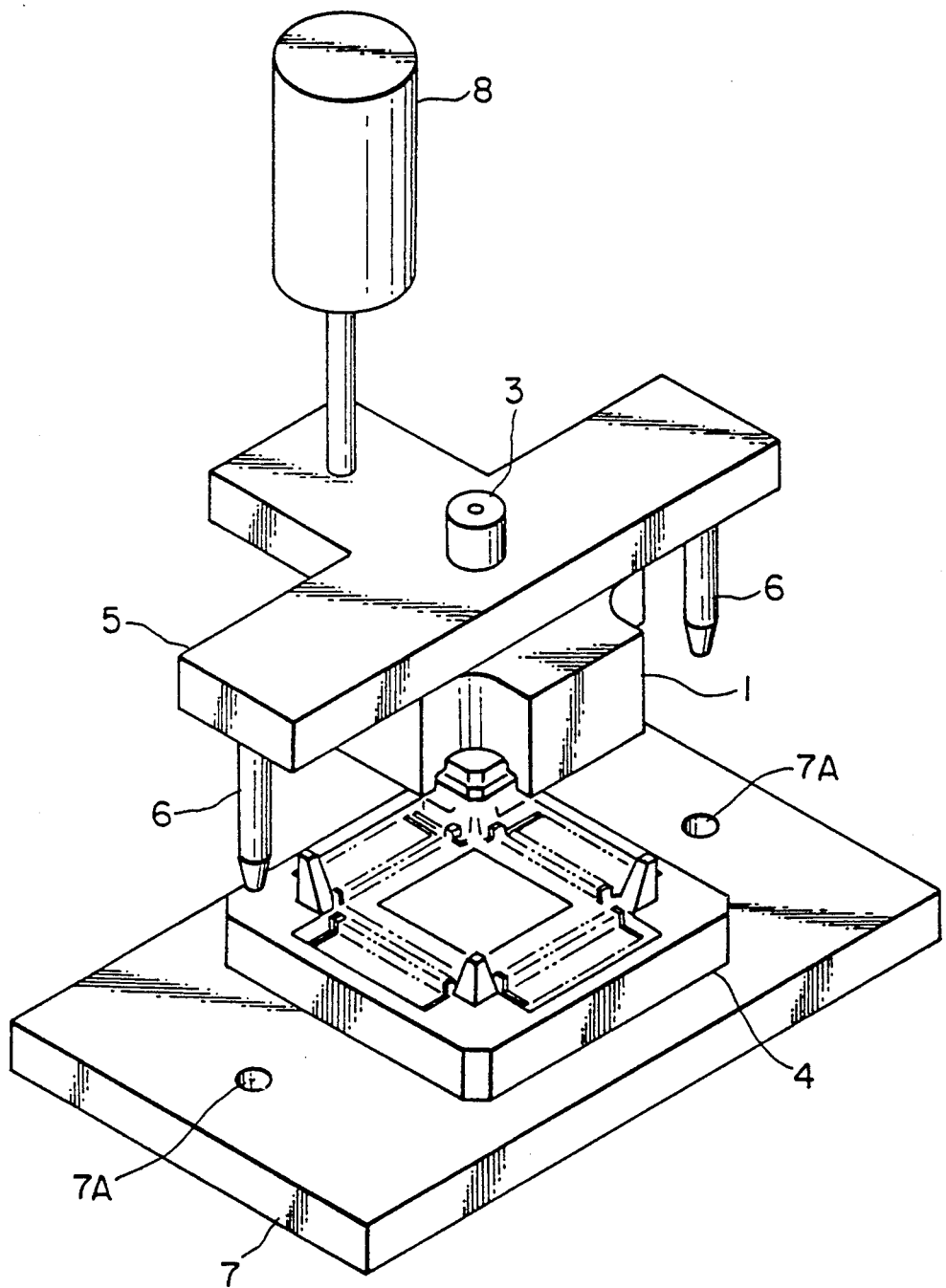
FIG. 3 is a driving mechanism of the IC contact mechanism of FIG. 1.

A driving mechanism of the IC contact mechanism will be described with reference to FIG. 3. In the same figure, designated at 5 is a guide plate, 6 is pins fixed to the guide plate 5, 7 is a socket attaching plate for attaching the IC socket thereto and 8 is a cylinder for vertically moving the guide plate 5. In FIG. 3, if the contact pressure application unit 1 is attached to the guide plate 5 and the pins 6 are inserted into guide holes 7A of the socket attaching plate 7, correct positioning between the IC 10 and the IC socket 4 can be made.

Figure 4:
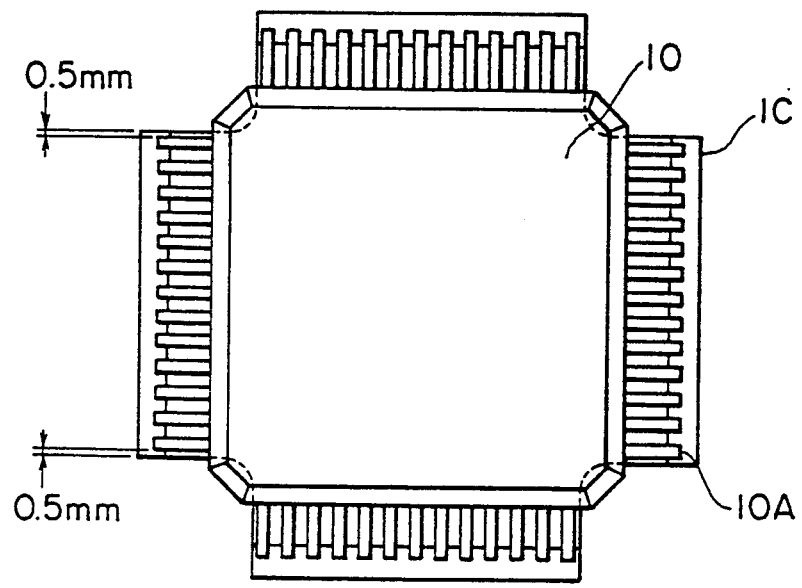
FIG. 4 is a bottom view of a contact pressure application unit, one of the components of the IC contact mechanism of FIG. 1.
Figure 5:
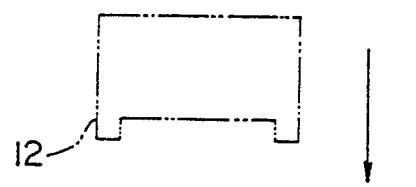
FIG. 5 is a view showing an arrangement of a conventional IC contact mechanism.
Figure 5:
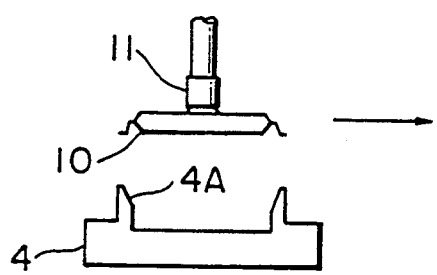
Figure 6:
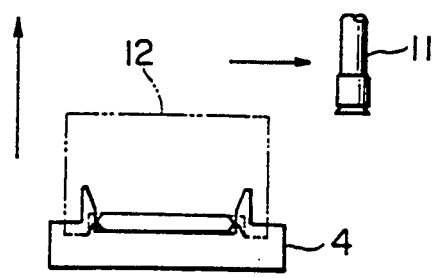
FIG. 6 is a view of assistance in explaining the state where an IC is dropped in an IC socket, respectively components of the IC contact mechanism of FIG. 5.
Figure 7:
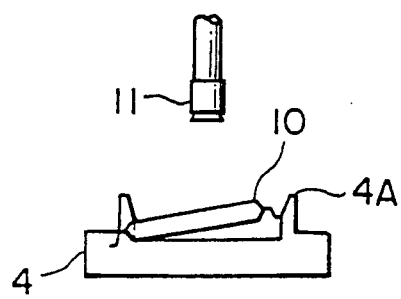
FIG. 7 is a view of assistance in explaining the state where the IC is caught by a tapered portion of the IC socket.
Figure 8:
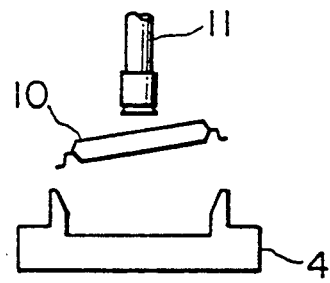
FIG. 8 is a view of assistance in explaining the state where the IC is dropped in the IC socket while it is inclined relative to the IC socket.

FIG. 4 shows the contact pressure application unit 1 as viewed from the bottom thereof. In FIG. 4, an outer dimensions of the lead presser portion 1C of the contact pressure application unit 1 is 0.5 mm as large as an outer dimensions of the lead 10A of the IC 10. Accordingly, even if the IC 10 is got out of position to some extend relative to the IC socket 4, the lead 10A is not bent by projecting from the contact pressure application unit 1.

With the arrangement of the IC contact mechanism according to the present invention, since the contact pressure application unit and the suction pad are incorporated into the IC contact mechanism, the IC can be inserted into and contact the IC socket without bending the lead of the IC.

What is claimed is:

1. An IC contact mechanism for inserting an integrated circuit package having external leads into a contact socket, said IC contact mechanism comprising:

a contact pressure application unit having a through hole at the center thereof, the contact pressure application unit also having a lateral guide means for accurately laterally positioning the integrated circuit package with respect to said contact pressure application, and a lead pressing means for pressing the external leads into the contact socket, the lead pressing means extending beyond the external leads to protect the external leads from bending during the insertion operation; and a suction block having a suction means at a tip end thereof and moveable vertically in the through hole of the contact pressure application unit, the suction means drawing the integrated circuit package into contact with the lateral guide means during the insertion operation.

2. The IC contact mechanism as claimed in claim 1 wherein the lead pressing means is a ring-like rectangular planar portion of the contact pressure application unit that extends approximately 0.5 mm past the external leads.

3. The IC contact mechanism as claimed in claim 2 wherein said lateral guide means is defined by a recess formed in the contact pressure application unit, the recess being surrounded by the lead pressing means.

4. An apparatus for inserting an integrated circuit package having external leads into a contact socket, said apparatus comprising:

a contact pressure application unit having a central bore therethrough and a contoured lower surface, said contoured lower surface defining a lateral guide means for accurately laterally positioning said integrated circuit package with respect to said contact pressure application unit, and a lead pressing means for pressing said external leads into the contact socket during an insertion operation, said lead pressing means extending past said external leads to protect the external leads from bending during insertion into the contact socket, and a suction block slidably mounted within said contact pressure application unit, said suction block including an attachment means for picking up and drawing said integrated circuit package into contact with said lateral guide means, and for drawing the external leads into contact with said lead pressing means.

5. The apparatus as claimed in claim 4 wherein said lead pressing means is a ring-like rectangular planar portion of said contact pressure application unit that surrounds said lateral guide means and extends approximately 0.5 mm past said external leads.

* * * * *

UNITED STATES PATENT AND TRADEMARK OFFICE
CERTIFICATE OF CORRECTION

PATENT NO. : 5,231,753

DATED : August 3, 1993

INVENTOR(S) : Toru Tanaka et al

It is certified that error appears in the above-identified patent and that said Letters Patent is hereby corrected as shown below:

Column 3, line 12; after "application" insert ---unit---.

Signed and Sealed this

Twelfth Day of April, 1994

Attest:

BRUCE LEHMAN

Attesting Officer

*Commissioner of Patents and Trademarks*